United States Patent
Yoon et al.

(10) Patent No.: US 10,720,930 B2
(45) Date of Patent: Jul. 21, 2020

(54) ELECTRONIC DEVICE INCLUDING PLURALITY OF PHASED LOCKED LOOP CIRCUITS

(71) Applicant: Samsung Electronics Co., Ltd., Suwon-si, Gyeonggi-do (KR)

(72) Inventors: Youngchang Yoon, Suwon-si (KR); Kyuhwan An, Suwon-si (KR); Daehyun Kang, Suwon-si (KR); Juho Son, Suwon-si (KR); Sunggi Yang, Suwon-si (KR); Donghyun Lee, Suwon-si (KR); Yunsung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/434,893

(22) Filed: Jun. 7, 2019

(65) Prior Publication Data

US 2019/0379385 A1 Dec. 12, 2019

(30) Foreign Application Priority Data

Jun. 7, 2018 (KR) .................. 10-2018-0065451

(51) Int. Cl.
*H03L 7/183* (2006.01)
*H03L 7/22* (2006.01)
(Continued)

(52) U.S. Cl.
CPC ............... *H03L 7/183* (2013.01); *H03L 7/07* (2013.01); *H03L 7/197* (2013.01); *H03L 7/22* (2013.01);
(Continued)

(58) Field of Classification Search
CPC . H01L 7/183; H01L 7/197; H01L 7/22; H01L 7/07; H01L 2207/50
(Continued)

(56) References Cited

U.S. PATENT DOCUMENTS 4,626,787 A * 12/1986 Mefford .................... H03L 7/23
327/107
5,572,168 A 11/1996 Kasturia
(Continued)

FOREIGN PATENT DOCUMENTS

CN 103533620 A 1/2014
EP 3 322 161 A1 5/2018

OTHER PUBLICATIONS

International Search Report dated Sep. 27, 2019, issued in International Application No. PCT/KR2019/006878.

*Primary Examiner* — John W Poos
(74) *Attorney, Agent, or Firm* — Jefferson IP Law, LLP

(57) ABSTRACT

A communication technique for converging internet of everything (IoT) technology with a $5^{th}$ generation (5G) communication system for supporting a higher data transfer rate beyond a 4G system is provided. The communication technique can be applied to intelligent services, based on 5G communication technology and IoT-related technology. In an embodiment, an electronic device includes a first processor configured to output a first signal for generating a first frequency signal, a second processor configured to output a second signal for generating a second frequency signal, a first radio frequency (RF) chip configured to output the first frequency signal, based on the first signal received from the first processor and a baseband signal, and a second RF chip configured to output the second frequency signal, based on the second signal received from the second processor and the first frequency signal outputted from the first RF chip.

20 Claims, 7 Drawing Sheets

(51) Int. Cl.
*H03L 7/07* (2006.01)
*H04W 72/04* (2009.01)
*H03L 7/197* (2006.01)

(52) U.S. Cl.
CPC ..... *H04W 72/0453* (2013.01); *H03L 2207/50* (2013.01)

(58) Field of Classification Search
USPC ......... 327/156, 158, 161; 375/371, 375, 376
See application file for complete search history.

(56) References Cited

U.S. PATENT DOCUMENTS

| | | |
|---|---|---|
| 5,625,324 A | 4/1997 | Hsu et al. |
| 7,560,960 B2 | 7/2009 | Park et al. |
| 2009/0163161 A1 | 6/2009 | Robinson et al. |
| 2012/0184228 A1 | 7/2012 | Mujtaba et al. |
| 2014/0126022 A1 | 5/2014 | Montierth et al. |
| 2019/0007074 A1 | 1/2019 | Shen et al. |

* cited by examiner

ELECTRONIC DEVICE INCLUDING PLURALITY OF PHASED LOCKED LOOP CIRCUITS

CROSS-REFERENCE TO RELATED APPLICATION(S)

This application is based on and claims priority under 35 U.S.C. § 119(a) of a Korean patent application number 10-2018-0065451, filed on Jun. 7, 2018, in the Korean Intellectual Property Office, the disclosures of which is incorporated by reference herein in its entirety.

BACKGROUND

1. Field

The disclosure relates to an electronic device including a plurality of phase locked loop (PLL) circuits for use in next generation communication technologies.

2. Description of Related Art

In order to satisfy the increasing demands of radio data traffic after the commercialization of a $4^{th}$ generation (4G) communication system, efforts have been made to develop an advanced $5^{th}$ generation (5G) communication system or a pre-5G communication system. For this reason, the 5G communication system or the pre-5G communication system is also referred to as a beyond-4G network communication system or a post-long-term evolution (LTE) system. In order to accomplish a higher data transfer rate, the implementation of the 5G communication system in a super-high frequency (mmWave) band (e.g., a 28 GHz band, a 39 GHz band, or a 60 GHz band) is being considered. Also, in order to obviate a propagation loss of a radio wave and increase a delivery distance of a radio wave in the super-high frequency band, discussions for the 5G communication system are underway about various techniques such as a beamforming, a massive multiple-input and multiple-output (MIMO), a full dimensional MIMO (FD-MIMO), an array antenna, an analog beam-forming, and a large scale antenna. Additionally, for an improvement in network of the 5G communication system, technical developments are being made in an advanced small cell, a cloud radio access network (cloud RAN), an ultra-dense network, a device to device (D2D) communication, a wireless backhaul, a moving network, a cooperative communication, coordinated multi-points (CoMP), a reception-end interference cancellation, and the like. Also, in the 5G communication system, a hybrid frequency shift keying (FSK) and quadrature amplitude modulation (QAM) modulation (FQAM) and a sliding window superposition coding (SWSC) are developed as advanced coding modulation (ACM) schemes, and a filter bank multi carrier (FBMC), a non-orthogonal multiple access (NOMA), and a sparse code multiple access (SCMA) are also developed as advanced access techniques.

The Internet, which is a human centered connectivity network where humans generate and consume information, is now evolving to the internet of things (IoT) where distributed entities, such as things, exchange and process information without human intervention. Further, the Internet of everything (IoE), which is a combination of IoT technology and big data processing technology through connection with a cloud server, has emerged. As technology elements, such as sensing technology, wired/wireless communication and network infrastructure, service interface technology, and security technology, have been demanded for IoT implementation, a sensor network, machine-to-machine (M2M) communication, machine type communication (MTC), and so forth have been recently researched. Such an IoT environment may provide intelligent Internet technology services that create a new value to human life by collecting and analyzing data generated among connected things. The IoT may be applied to a variety of fields including smart home, smart building, smart city, smart car or connected car, smart grid, health care, smart appliances, advanced medical service, etc., through convergence and combination between existing information technology (IT) and various industrial applications.

In line with this, various attempts have been made to apply the 5G communication system to the IoT network. For example, technologies such as a sensor network, MTC, and M2M communication are being implemented on the basis of 5G communication technologies such as beamforming, MIMO, and an array antenna. The use of a cloud RAN for big data processing technology is one example of convergence between the 5G technology and the IoT technology.

The next generation communication system may utilize a super-high frequency (mmWave) band. In super-high frequency band communications, an interval between subcarriers relative to frequency may be narrowed, and a frequency band used for communication may be higher. Thus, the quality of a signal may be deteriorated.

Particularly, when a frequency conversion is performed several times within an electronic device to generate a signal of a super-high frequency band, the deterioration of a signal quality may be caused more significantly.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to address at least the above-mentioned problems and/or disadvantages and to provide an electronic device that includes a first processor configured to output a first signal for generating a first frequency signal, a second processor configured to output a second signal for generating a second frequency signal, a first radio frequency (RF) chip configured to output the first frequency signal, based on the first signal received from the first processor and a baseband signal, and a second RF chip configured to output the second frequency signal, based on the second signal received from the second processor and the first frequency signal outputted from the first RF chip.

Additional aspects will be set forth in part in the description which follows and, in part, will be apparent from the description, or may be learned by practice of the presented embodiments.

In accordance with an aspect of the disclosure, an electronic device is provided. The electronic device includes a third processor configured to supply a clock signal to each of the first processor and the second processor so as to synchronize the first and second frequency signals.

A correlation between a phase noise of the first frequency signal and a phase noise of the second frequency signal may be lower than a predetermined threshold.

The first processor or the second processor may be included in the first RF chip or the second RF chip.

In accordance with another aspect of the disclosure, an electronic device is provided. The electronic device includes a plurality of second RF chips each of which receives the first frequency signal from the first RF chip and converts, based on the second signal received from the second processor, the first frequency signal into the second frequency signal to be outputted, and the second processor may output, to each of the plurality of second RF chips, the second signal to be used for generating the second frequency signal.

Each of the first processor and the second processor may include a phased locked loop (PLL) circuit.

In accordance with another aspect of the disclosure, a mobile device is provided. The mobile device includes a first processor configured to output a first signal for generating a first frequency signal, a second processor configured to output a second signal for generating a second frequency signal, a first RF chip configured to output the first frequency signal, based on the first signal received from the first processor and a baseband signal, and a second RF chip configured to output the second frequency signal, based on the second signal received from the second processor and the first frequency signal outputted from the first RF chip.

The mobile device may further include a third processor configured to supply a clock signal to each of the first processor and the second processor so as to synchronize the first and second frequency signals.

A correlation between a phase noise of the first frequency signal and a phase noise of the second frequency signal may be lower than a predetermined threshold.

The first processor or the second processor may be included in the first RF chip or the second RF chip.

In accordance with another aspect of the disclosure, a mobile device is provided. The mobile device includes a plurality of second RF chips each of which receives the first frequency signal from the first RF chip and converts, based on the second signal received from the second processor, the first frequency signal into the second frequency signal to be outputted, and the second processor may output, to each of the plurality of second RF chips, the second signal to be used for generating the second frequency signal.

Each of the first processor and the second processor may include a PLL circuit.

In accordance with another aspect of the disclosure, an electronic device is provided. The electronic device includes a first processor configured to output a first signal for generating a first frequency signal, a second processor configured to output a second signal for generating a baseband signal, a first RF chip configured to output the first frequency signal, based on the first signal received from the first processor and a second frequency signal received, and a second RF chip configured to output the baseband signal, based on the second signal received from the second processor and the first frequency signal outputted from the first RF chip.

According to embodiments of the disclosure, it is possible to prevent the deterioration of a signal quality that may be caused when transmitting a signal in a super-high frequency band.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
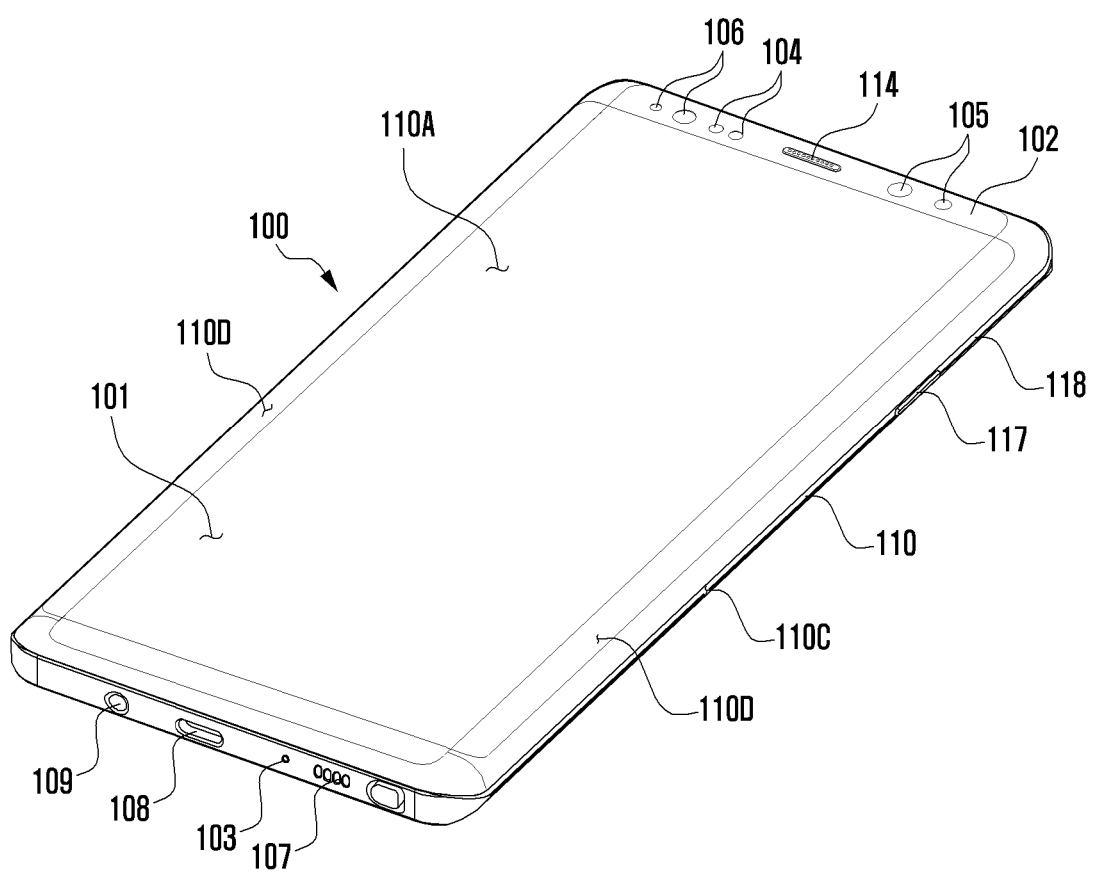
FIG. 1 is a perspective view illustrating a front surface of a mobile electronic device according to an embodiment of the disclosure.

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description, description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For the same reason, some elements in the drawings are exaggerated, omitted, or schematically illustrated. Also, the size of each element does not entirely reflect the actual size. In the drawings, the same or corresponding elements are denoted by the same reference numerals.

The advantages and features of the disclosure and the manner of achieving them will become apparent with reference to the embodiments described in detail below and with reference to the accompanying drawings. The disclosure may, however, be embodied in many different forms and should not be construed as being limited to the embodiments set forth herein. Rather, these embodiments are provided so that this disclosure will be thorough and complete and will fully convey the scope of the disclosure to those skilled in the art. To fully disclose the scope of the disclosure to those skilled in the art, the disclosure is only defined by the scope of claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

In addition, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, refers to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and modules. In addition, the components and units may be implemented to operate one or more central processing units (CPUs) in a device or a secure multimedia card. In embodiments, a certain unit may include one or more processors.

Figure 2:
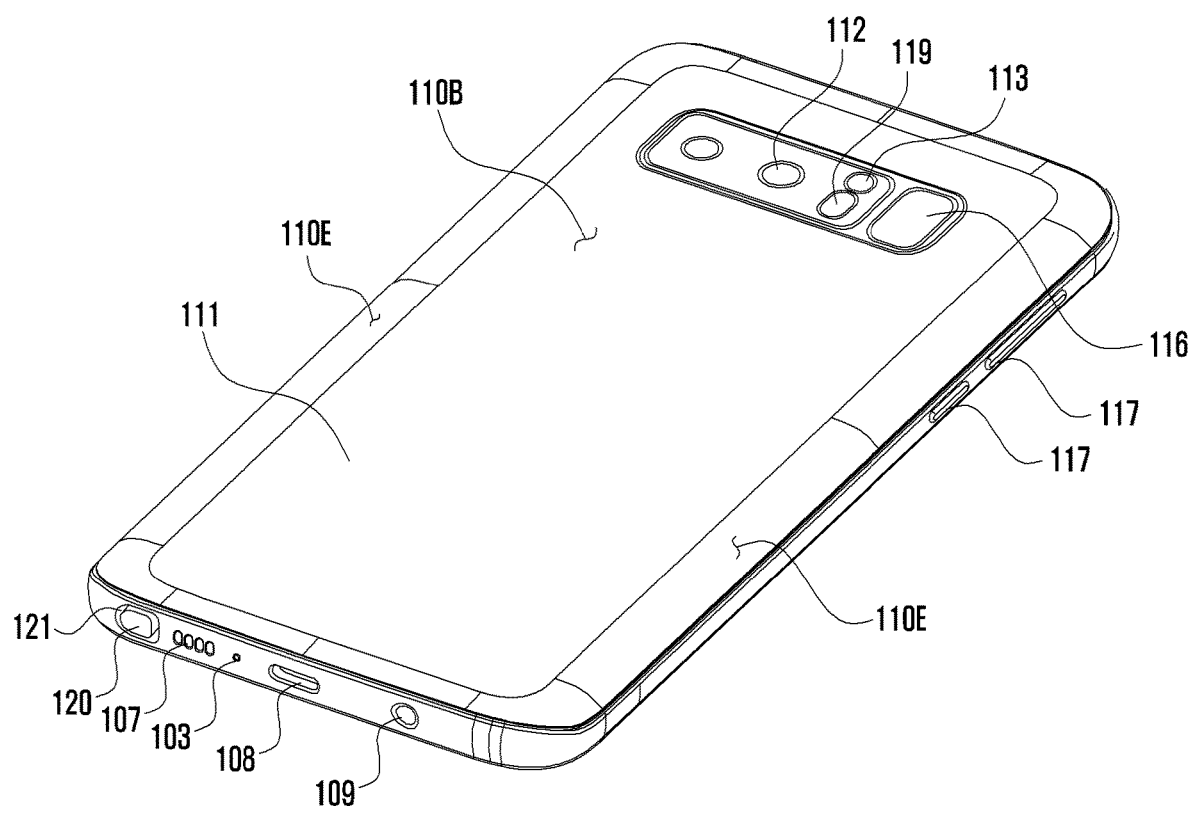
FIG. 2 is a perspective view illustrating a rear surface of the electronic device shown in FIG. 1 according to an embodiment of the disclosure.

FIG. 1 is a perspective view illustrating a front surface of a mobile electronic device according to an embodiment of the disclosure, FIG. 2 is a perspective view illustrating a rear surface of an electronic device shown in FIG. 1 according to an embodiment of the disclosure.

Referring to FIGS. 1 and 2, an electronic device 100 according to an embodiment may include a housing 110 that includes a first surface (or front surface) 110A, a second surface (or rear surface) 110B, and a lateral surface 110C that surrounds a space between the first surface 110A and the second surface 110B. In another embodiment (not shown), the housing may refer to a structure that forms a part of the first surface 110A, of the second surface 110B, and of the lateral surface 110C. According to an embodiment, the first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. In a certain embodiment, the rear plate 111 and the lateral bezel structure 118 may be integrally formed and may have the same material (e.g., a metallic material such as aluminum).

In the illustrated embodiment, the front plate 102 may include two first regions 110D disposed at long edges thereof, respectively, and bent and extended seamlessly from the first surface 110A toward the rear plate 111. Similarly, the rear plate 211 may include two second regions 110E disposed at long edges thereof, respectively, and bent and extended seamlessly from the second surface 110B toward the front plate 102. In a certain embodiment, the front plate 102 (or the rear plate 111) may include only one of the first regions 110D (or of the second regions 110E). In another embodiment, the first regions 110D or the second regions 110E may not be included in part. In such embodiments, when viewed from a lateral side of the electronic device 100, the lateral bezel structure 118 may have a first thickness (or width) on a lateral side where the first or second region 110D or 110E is not included, and may have a second thickness, being smaller than the first thickness, on another lateral side where the first or second region 110D or 110E is included.

According to an embodiment, the electronic device 100 may include at least one of a display 101, audio modules 103, 107 and 114, sensor modules 104, 116 and 119, camera modules 105, 112 and 113, a key input device 117, a light emitting device 106, a pen input device 120, and connector holes 108 and 109. In a certain embodiment, the electronic device 100 may omit at least one (e.g., the key input device 117 or the light emitting device 106) of the above components, or may further include any other component.

The display 101 may be exposed through a substantial portion of the front plate 102, for example. In a certain embodiment, at least a part of the display 101 may be exposed through the front plate 102 that forms the first surface 110A and the first region 110D of the lateral surface 110C. In a certain embodiment, outlines (i.e., edges and corners) of the display 101 may have the substantially same form as those of the front plate 102. In another embodiment (not shown), the spacing between the outline of the display 101 and the outline of the front plate 102 may be substantially unchanged in order to enlarge the exposed area of the display 101.

In another embodiment (not shown), a recess or opening may be formed in a portion of a display area of the display 101 to accommodate at least one of the audio module 114, the sensor module 104, the camera module 105, and the light emitting device 106. In still another embodiment (not shown), at least one of the audio module 114, the sensor module 104, the camera module 105, the fingerprint sensor 116, and the light emitting device 106 may be disposed on the back of the display area of the display 101. In yet another embodiment (not shown), the display 101 may be combined with or adjacent to a touch sensing circuit, a pressure sensor capable of measuring the touch strength (pressure), and/or a digitizer for detecting a stylus pen. In some embodiments, at least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in any case, contain a plurality of microphones to sense a sound direction. The speaker holes 107 and 114 may be classified into an external speaker hole 107 and a call receiver hole 114. In some embodiments, such holes of audio modules 103, 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the electronic device 100 or to an external environmental condition. The sensor modules 104, 116 and 119 may include a first sensor module 104 (e.g., a proximity sensor) and/or a second sensor module (not shown, e.g., a fingerprint sensor) disposed on the first surface 110A of the housing 110, and/or a third sensor module 119 (e.g., an HRM sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. Although not shown, the electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or 112 may include one or more lenses, an image sensor, and/or an image signal processor (ISP). The flash 113 may include, for example, a light emitting diode or a xenon lamp. In some embodiments, two or more lenses (infrared cameras, wide angle and telephoto lenses) and image sensors may be disposed on one side of the electronic device 100.

The key input device 117 may be disposed on the lateral surface 110C of the housing 110. In another embodiment, the electronic device 100 may not include some or all of the above-mentioned key input devices 117, and the key input device 117 which is not included may be implemented in any other form such as a soft key on the display 101. In a certain embodiment, the key input device may include the sensor module 116 disposed on the second surface 110B of the housing 110.

The light emitting device 106 may be disposed on the first surface 110A of the housing 110. For example, the light emitting device 106 may provide status information of the electronic device 100 in optical form. In another embodiment, the light emitting device 106 may provide a light source associated with the operation of the camera module 105. The light emitting device 106 may include, for example, an LED, an IR LED, or a xenon lamp.

The connector holes 108 and 109 may include a first connector hole 108 adapted for a connector (e.g., a USB connector) of transmitting and receiving power and/or data to and from an external electronic device, and/or a second connector hole 109 adapted for a connector (e.g., an earphone jack) of transmitting and receiving an audio signal to and from an external electronic device.

The pen input device 120 (e.g., a stylus pen) may be inserted into or removed from the housing 110 through a hole 121 formed in a lower lateral surface of the housing 110. To facilitate the removal, the pen input device 120 may have a button. The pen input device 120 may include a resonance circuit embedded therein to interact with an electromagnetic induction panel (390 in FIG. 3, e.g., a digitizer) included in the electronic device 100. The pen input device 120 may be implemented based on an electromagnetic resonance (EMR) technique, an active electrical stylus (AES) technique, or an electric coupled resonance (ECR) technique.

Figure 3:
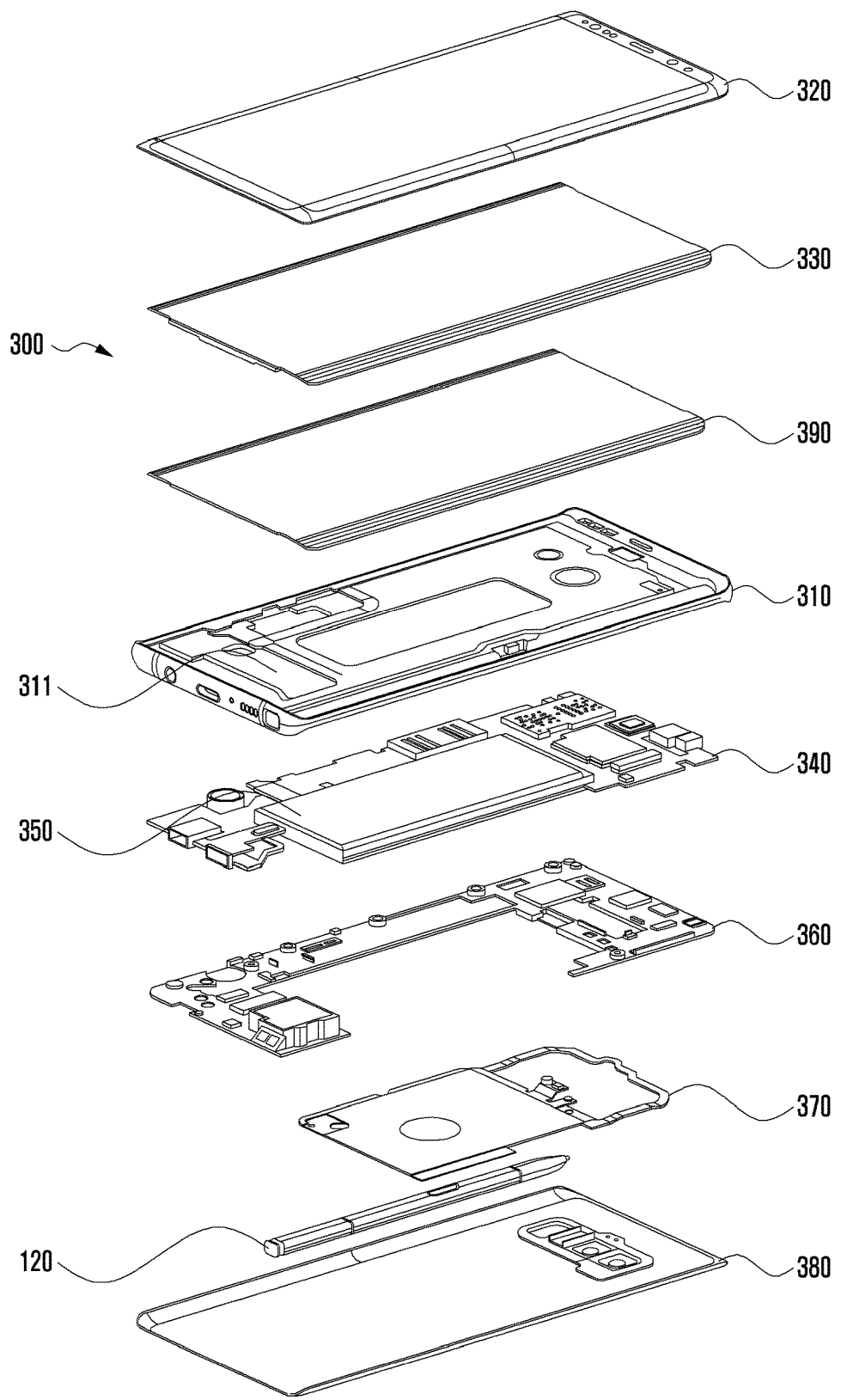
FIG. 3 is an exploded perspective view illustrating the electronic device shown in FIG. 1 according to an embodiment of the disclosure.

FIG. 3 is an exploded perspective view illustrating an electronic device shown in FIG. 1 according to an embodiment of the disclosure.

Referring to FIG. 3, an electronic device 300 may include a lateral bezel structure 310, a first support member 311 (e.g., a bracket), a front plate 320, a display 330, an electromagnetic induction panel 390, a printed circuit board (PCB) 340, a battery 350, a second support member 360 (e.g., a rear case), an antenna 370, the pen input device 120, and a rear plate 380. In some embodiments, the electronic device 300 may not include at least one (e.g., the first support member 311 or the second support member 360) of the above components or may further include any other component. Some components of the electronic device 300 may be the same as or similar to those of the electronic device 100 shown in FIG. 1 or 2, so that repeated descriptions are omitted below.

The electromagnetic induction panel 390 (e.g., a digitizer) may be a panel for detecting an input of the pen input device 120. For example, the electromagnetic induction panel 390 may include a PCB (e.g., a flexible PCB (FPCB)) and a shielding sheet. The shielding sheet is capable of preventing interference that may be caused by electromagnetic fields generated from components (e.g., the display module, the PCB, the electromagnetic induction panel, and/or the like) contained in the electronic device 100. By shielding the electromagnetic fields generated from the components, the input of the pen input device 120 may be accurately transferred to a coil included in the electromagnetic induction panel 390. In some embodiments, the electromagnetic induction panel 390 may include an opening formed to correspond to a biometric sensor mounted in the electronic device 100.

The first support member 311 is disposed inside the electronic device 300 and may be connected to or integrated with the lateral bezel structure 310. The first support member 311 may be formed of, for example, a metal material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a CPU, an application processor (AP), a graphics processing unit (GPU), an ISP, a sensor hub processor, or a communications processor (CP).

The memory may include, for example, volatile memory or non-volatile memory. The interface may include, for example, a high definition multimedia interface (HDMI), a universal serial bus (USB) interface, a san disc (SD) card interface, and/or an audio interface. The interface may electrically or physically connect the electronic device 300 with an external electronic device and may include a USB connector, an SD card/MMC connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on the substantially same plane as the PCB 340. The battery 350 may be integrally disposed within the electronic device 300, and may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. In another embodiment, an antenna structure may be formed by a part or combination of the lateral bezel structure 310 and/or the first support member 311.

Figure 4:
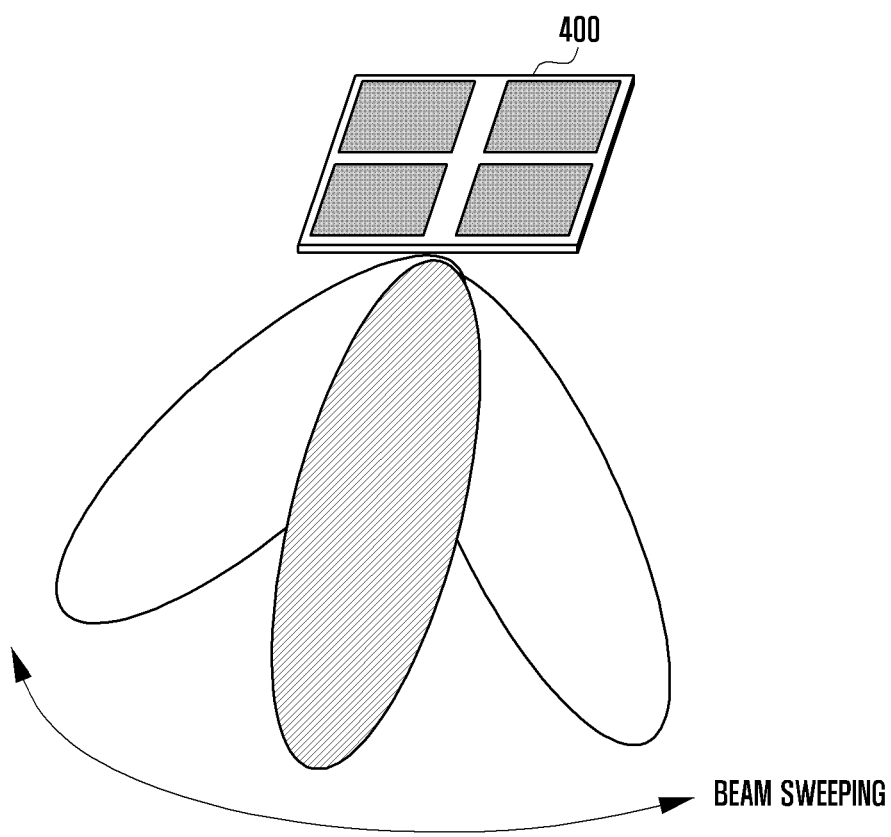
FIG. 4 is a schematic diagram illustrating a beam sweeping through an RF chip according to an embodiment of the disclosure.

FIG. 4 is a schematic diagram illustrating a beam sweeping through an RF chip according to an embodiment of the disclosure.

As described above, the communication system using the mmWave band is required to consider a new scheme different from typical wireless communication schemes. Particularly, in the mmWave band, as the frequency increases, the gain loss of a beam radiated through the RF chip may become large.

Therefore, in order to minimize the gain loss of a beam, a multi-chain structure composed of a plurality of RF chains may be used in the mmWave band.

Referring to FIG. 4, one RF chip 400 may have the multi-chain structure composed of four RF chains and may form a beam through this multi-chain structure to perform a beam sweeping.

However, there is a physical limitation in realizing the multi-chain structure in one RF chip. That is, because one RF chip has a limitation in area, the number of chains constituting one RF chip 400 as shown in FIG. 4 is restricted.

Unlike the RF chip 400 shown in FIG. 4, up to 32 chains may be implemented in one RF chip if necessary. Nevertheless, in the mmWave communication system, 256 chains, 1024 chains, or more may be required within one electronic device in some cases.

Therefore, in order to solve the above problems, a method for constructing a multi-chain structure by using a plurality of RF chips may be considered. Now, a detailed description will be given with reference to FIG. 5.

Figure 5:
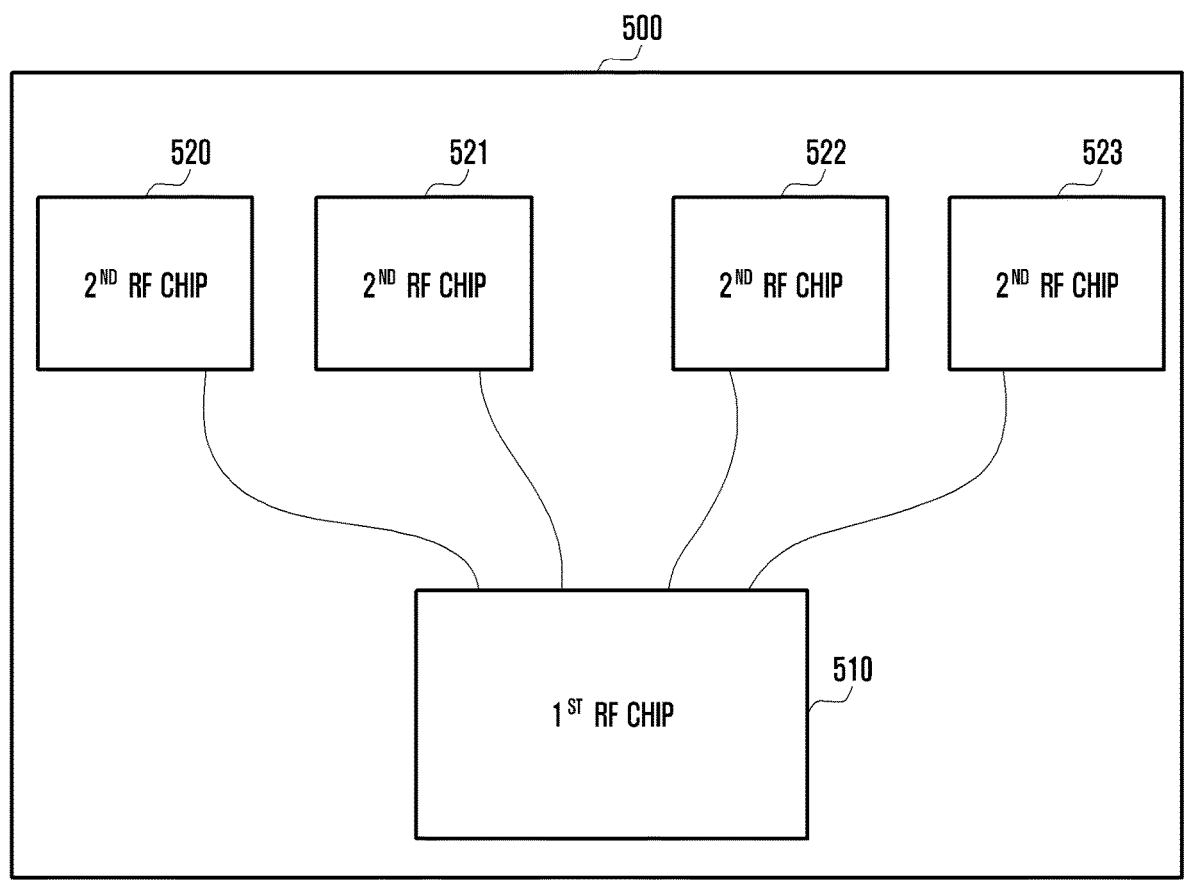
FIG. 5 is a block diagram illustrating a structure of an electronic device having a plurality of second RF chips according to an embodiment of the disclosure.

FIG. 5 is a block diagram illustrating a structure of an electronic device having a plurality of second RF chips according to an embodiment of the disclosure.

Referring to FIG. 5, according to an embodiment, the electronic device 500 includes one first RF chip 510 and four second RF chips 520, 521, 522 and 523. According to an embodiment, all of the first RF chip 510 and the second RF chips 520, 521, 522 and 523 are RF chips capable of performing beamforming in the mmWave band.

Because the mmWave band uses a high frequency, RF chips for realizing such a high frequency may be classified into the first RF chip 510 and a plurality of second RF chips 520, 521, 522 and 523 as shown in FIG. 5.

According to an embodiment, the plurality of second RF chips 520, 521, 522 and 523 may be disposed at one end of the electronic device 500 and emit the beam to the outside of the electronic device 500. In this regard, the second RF chip may be referred to as a front-end chip. According to one embodiment, each of the plurality of second RF chips 520, 521, 522 and 523 may have a plurality of RF chains as described above in FIG. 4.

However, as described above with reference to FIG. 4, increasing the number of RF chains using one RF chip is limited. In contrast, FIG. 5 relates to a method for increasing the number of RF chains through four second RF chips 520, 521, 522 and 523.

For example, when up to 16 RF chains can be implemented in one second RF chip, the electronic device 500 shown in FIG. 5 is capable of implementing 64 RF chains in total (16 RF chains*4 chips=64 RF chains).

According to an embodiment, each of the first RF chip 510 and the second RF chips 520, 521, 522 and 523 is capable of converting a frequency of an input signal and then outputting a signal having a specific frequency. For example, the first RF chip 510 may convert a baseband signal to a first signal having a frequency of 10 GHz. Each of the second RF chips 520, 521, 522 and 523 may receive the first signal from the first RF chip 510 and convert the first signal into a second signal having a frequency of 30 GHz.

A process of converting a frequency of an input signal at each of the first RF chip 510 and the second RF chips 520, 521, 522 and 523 will be described hereinafter with reference to FIGS. 6 and 7.

Figure 6:
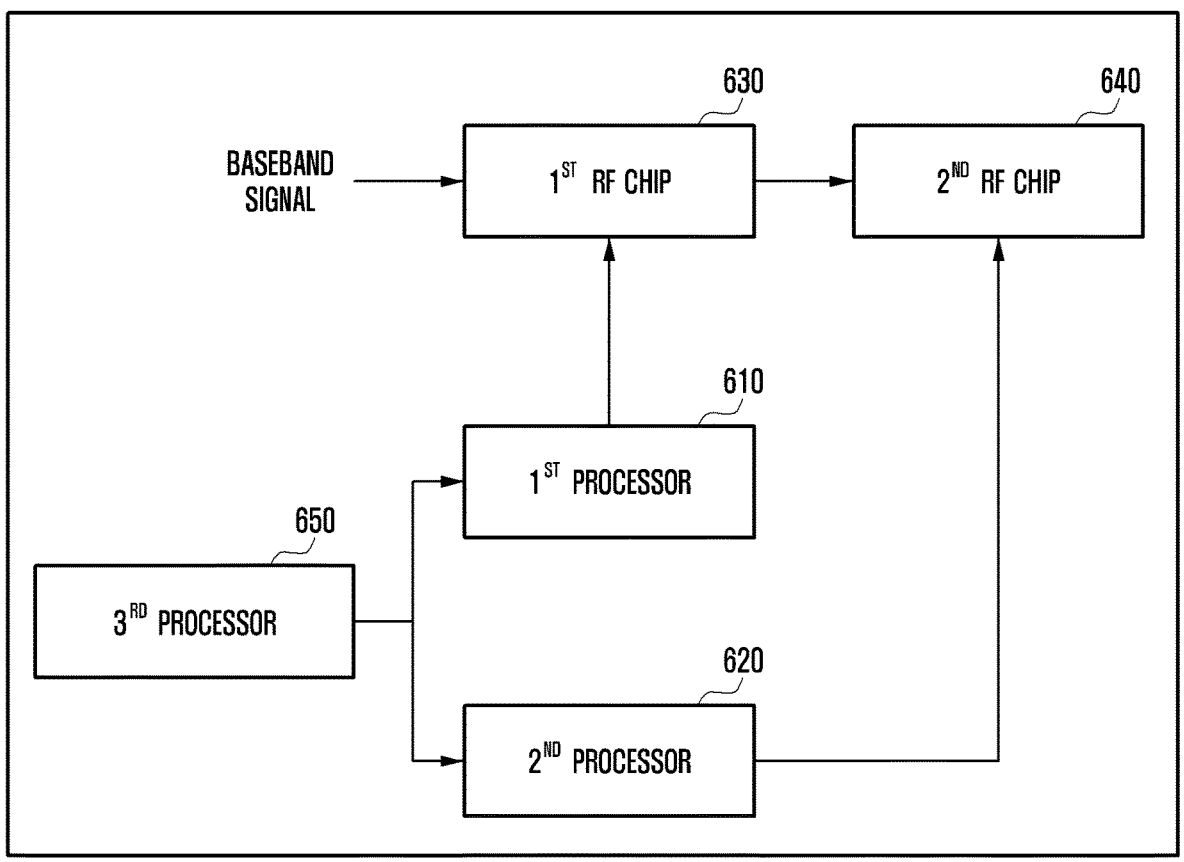
FIG. 6 is a block diagram illustrating a structure of an electronic device according to an embodiment of the disclosure.

FIG. 6 is a block diagram illustrating a structure of an electronic device according to an embodiment of the disclosure.

Referring to FIG. 6, according to an embodiment, an electronic device 600 may include a first processor configured to output a first signal for generating a first frequency signal, a second processor 620 configured to output a second signal for generating a second frequency signal, a first RF chip 630 configured to output the first frequency signal, based on the first signal received from the first processor 610 and a baseband signal, and a second RF chip 640 configured to output the second frequency signal, based on the second signal received from the second processor 620 and the first frequency signal outputted from the first RF chip 630.

According to an embodiment, the electronic device 600 may further include a third processor 650 configured to supply a clock signal to each of the first processor 610 and the second processor 620 so as to synchronize the first and second frequency signals. According to an embodiment, the third processor 650 may include a crystal clock generator (XTAL).

According to an embodiment, a correlation between a phase noise of the first frequency signal outputted from the first RF chip 630 and a phase noise of the second frequency signal outputted from the second RF chip 640 may be lower than a predetermined threshold. Here, the predetermined threshold indicates a limit value that prevents the sum of the phase noise of the first frequency signal and the phase noise of the second frequency signal from exceeding a voltage sum.

For example, when the correlation between the phase noise of the first frequency signal and the phase noise of the second frequency signal is higher, the phase noise of the first frequency signal and the phase noise of the second frequency signal may have similar phase distributions. That is, a peak time of the first frequency signal phase noise and a peak time of the second frequency signal phase noise may be similar to each other.

Thus, in this case, the sum of the phase noise of the first frequency signal and the phase noise of the second frequency signal may have a maximum value (i.e., the sum of the phase noise of the first frequency signal and the phase noise of the second frequency signal may become the voltage sum). Therefore, a signal quality of a beam emitted through the electronic device 600 may deteriorate.

Meanwhile, according to the disclosure, the first frequency signal is generated based on the first signal outputted from the first processor 610, and the second frequency signal is generated based on the second signal outputted from the second processor 620. That is, a source for generating the first frequency signal and a source for generating the second frequency signal are different from each other.

Therefore, according to the disclosure, the correlation between the first frequency signal generated on the basis of the first signal outputted from the first processor 610 and the second frequency signal generated on the basis of the second signal outputted from the second processor 620 may have a low value, which may be lower than the predetermined threshold.

That is, according to an embodiment of the disclosure, the phase noise of the first frequency signal and the phase noise of the second frequency signal may have phase distributions of a low correlation. Therefore, the peak time of the phase noise of the first frequency signal and the peak time of the phase noise of the second frequency signal may not coincide with each other, so that the sum of the phase noise of the first frequency signal and the phase noise of the second frequency signal may be a power sum rather than a voltage sum.

According to an embodiment, each of the first processor 610 and the second processor 620 may include a phased locked loop (PLL) circuit. The PLL circuit may be used to detect a phase difference between an input signal and an output signal and, based thereon, generate a frequency signal precisely fixed with a circuit that controls an oscillator.

According to an embodiment, as described above in FIG. 5, the electronic device 600 may include the plurality of second RF chips each of which receives the first frequency signal from the first RF chip 630 and converts, based on the second signal, the first frequency signal into the second frequency signal to be outputted. At this time, the second processor 620 may output, to each of the second RF chips, the second signal to be used for generating the second frequency signal.

Figure 7:
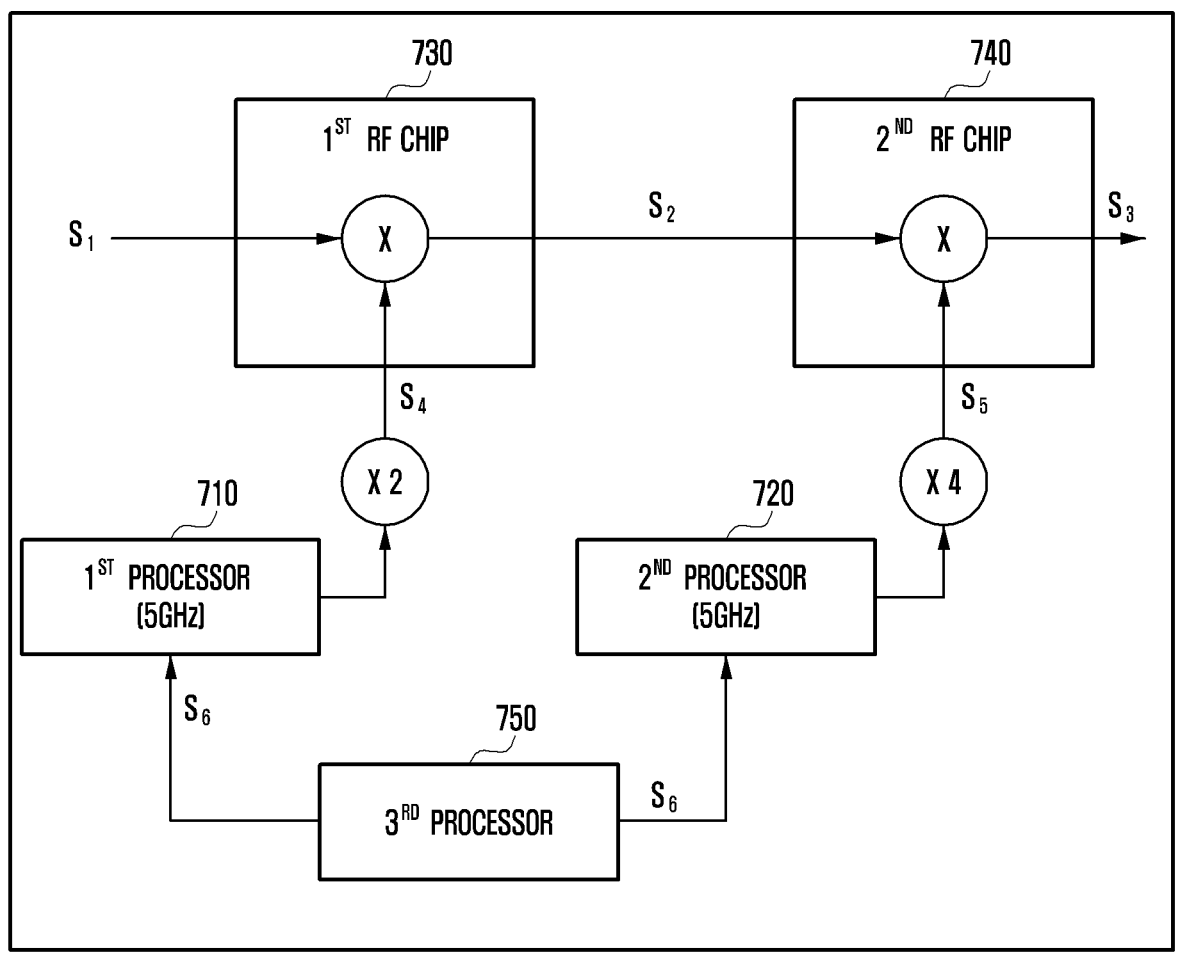
FIG. 7 is a block diagram illustrating a signal flow inside an electronic device according to an embodiment of the disclosure.

FIG. 7 is a block diagram illustrating a signal flow inside an electronic device according to an embodiment of the disclosure.

Referring to FIG. 7, according to an embodiment, an electronic device 100 may include a first processor 710, which may output the first signal ($S_4$) to be used for generating the first frequency signal ($S_2$). For example, the first signal ($S_4$) may be a signal having a frequency of 5 GHz. In addition, a second processor 720 may output the second signal ($S_5$) to be used for generating the second frequency signal ($S_3$). For example, the second signal ($S_5$) may be a signal having a frequency of 5 GHz. According to an embodiment, the second frequency signal ($S_3$) may be the sum of the second signal ($S_5$) and the first frequency signal ($S_2$). For example, in an embodiment shown in FIG. 7, the second frequency signal ($S_3$) may be the sum of the first frequency signal ($S_2$) having a frequency of 10 GHz (5 GHz*2=10 GHz) and the second signal ($S_5$) having a frequency of 20 GHz (5 GHz*4=20 GHz). That is, the second frequency signal ($S_3$) may be a frequency signal having a frequency of 30 GHz (10 GHz+20 GHz). A detailed process of deriving the second frequency signal ($S_3$) will be described later.

According to an embodiment, the third processor 750 may supply a clock signal ($S_6$) to each of the first processor 710 and the second processor 720 so as to synchronize the first and second signals respectively outputted from the first and second processors 710 and 720.

According to an embodiment, the first RF chip 730 may receive a baseband signal ($S_1$) and output the first frequency signal ($S_2$). Specifically, the first RF chip 730 may receive, from the first processor 710, the first signal ($S_4$) to be used for generating the first frequency signal ($S_2$).

According to an embodiment, the frequency (5 GHz) of the first signal outputted by the first processor 710 may be doubled before the first signal is applied to the first RF chip 730. That is, the first signal ($S_4$) may have a frequency of 10 GHz when supplied to the first RF chip 730. In this case, the first RF chip 730 may output the first frequency signal ($S_2$) having a frequency of 10 GHz, based on the baseband signal ($S_1$) and the first signal ($S_4$) having a frequency of 10 GHz.

According to an embodiment, the second RF chip 740 may receive the first frequency signal ($S_2$) and output the second frequency signal ($S_3$). Specifically, the second RF chip 740 may receive, from the second processor 720, the second signal ($S_5$) to be used for generating the second frequency signal ($S_3$).

According to an embodiment, the frequency (5 GHz) of the second signal outputted by the second processor 720 may be quadrupled before the second signal is applied to the second RF chip 740. That is, the second signal ($S_5$) may have a frequency of 20 GHz when supplied to the second RF chip 740. In this case, the second RF chip 740 may output the second frequency signal ($S_3$) having a frequency of 30 GHz, based on the first frequency signal ($S_2$) and the second signal ($S_5$) having a frequency of 20 GHz.

The signal flow shown in FIG. 7 is only exemplary and not to be construed as a limitation of the disclosure. For example, the frequency of the second frequency signal outputted through the second RF chip may fall within a frequency band of 20 GHz to 100 GHz used in the next generation communication system.

Although this disclosure focuses on only frequency up-conversion performed at a transmitter, this is only exemplary and not to be construed as a limitation of the disclosure. The technical principles described herein may be equally or similarly applied to frequency down-conversion performed at a receiver.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first processor configured to output a first signal for generating a first frequency signal;
   a second processor configured to output a second signal for generating a second frequency signal;
   a third processor configured to adjust a correlation of the first frequency signal and the second frequency signal;

a first radio frequency (RF) chip configured to output the first frequency signal, based on the first signal received from the first processor and a baseband signal; and
a second RF chip configured to output the second frequency signal, based on the second signal received from the second processor and the first frequency signal outputted from the first RF chip.

2. The electronic device of claim 1,
wherein the third processor is further configured to supply a clock signal to each of the first processor and the second processor, the supplied clock signal synchronizing the first frequency signal and the second frequency signal.

3. The electronic device of claim 1, wherein the third processor is configured to adjust the correlation of a phase noise of the first frequency signal and a phase noise of the second frequency signal to be lower than a predetermined threshold.

4. The electronic device of claim 1, wherein the first processor is included in the first RF chip and the second processor is included in the second RF chip.

5. The electronic device of claim 1,
wherein the electronic device includes a plurality of second RF chips each of which receives the first frequency signal from the first RF chip and converts, based on the second signal received from the second processor, the first frequency signal into second frequency signals to be outputted, and
wherein the second processor outputs, to each of the plurality of second RF chips, the second signal to be used for generating the second frequency signals.

6. The electronic device of claim 1, wherein each of the first processor and the second processor includes a phased locked loop (PLL) circuit.

7. A terminal in a wireless communication system, the terminal comprising:
a first processor configured to output a first signal for generating a first frequency signal;
a second processor configured to output a second signal for generating a second frequency signal;
a third processor configured to adjust a correlation of the first frequency signal and the second frequency signal;
a first radio frequency (RF) chip configured to output the first frequency signal, based on the first signal received from the first processor and a baseband signal; and
a second RF chip configured to output the second frequency signal, based on the second signal received from the second processor and the first frequency signal outputted from the first RF chip.

8. The terminal of claim 7,
wherein the third processor is further configured to supply a clock signal to each of the first processor and the second processor, the supplied clock signal synchronizing the first frequency signal and the second frequency signal.

9. The terminal of claim 7, wherein the third processor is configured to adjust the correlation of a phase noise of the first frequency signal and a phase noise of the second frequency signal to be lower than a predetermined threshold.

10. The terminal of claim 7, wherein the first processor is included in the first RF chip and the second processor is included in the second RF chip.

11. The terminal of claim 7,
wherein the terminal includes a plurality of second RF chips each of which receives the first frequency signal from the first RF chip and converts, based on the second signal received from the second processor, the first frequency signal into second frequency signals to be outputted, and
wherein the second processor outputs, to each of the plurality of second RF chips, the second signal to be used for generating the second frequency signals.

12. The terminal of claim 7, wherein each of the first processor and the second processor includes a phased locked loop (PLL) circuit.

13. A method performed by an electronic device comprising a first processor, a second processor, a third processor, a first radio frequency (RF) chip, and a second RF chip, the method comprising:
generating, by the third processor, an adjusting signal for adjusting a correlation of a first frequency signal and a second frequency signal;
generating, by the first processor, a first signal based on the adjusting signal;
generating, by the first RF chip, the first frequency signal based on a baseband signal and the first signal;
generating, by the second processor, a second signal based on the adjusting signal;
generating, by the second RF chip, the second frequency signal based on the first frequency signal and the second signal; and
outputting, by the second RF chip, the second frequency signal.

14. The method of claim 13, further comprising:
supplying, by the third processor, a clock signal to each of the first processor and the second processor, the supplied clock signal synchronizing the first frequency signal and the second frequency signal.

15. The method of claim 13, further comprising:
adjusting, by the third processor, the correlation of a phase noise of the first frequency signal and a phase noise of the second frequency signal to be lower than a predetermined threshold.

16. The method of claim 13,
wherein the first processor is included in the first RF chip and the second processor is included in the second RF chip, and
wherein each of the first processor and the second processor includes a phased locked loop (PLL) circuit.

17. A method performed by a terminal in a wireless communication system, the terminal comprising a first processor, a second processor, a third processor, a first radio frequency (RF) chip, and a second RF chip, the method comprising:
generating, by the third processor, an adjusting signal for adjusting a correlation of a first frequency signal and a second frequency signal;
generating, by the first processor, a first signal based on the adjusting signal;
generating, by the first RF chip, the first frequency signal based on a baseband signal and the first signal;
generating, by the second processor, a second signal based on the adjusting signal;
generating, by the second RF chip, the second frequency signal based on the first frequency signal and the second signal; and
outputting, by the second RF chip, the second frequency signal.

18. The method of claim 17, further comprising:
supplying, by the third processor, a clock signal to each of the first processor and the second processor, the supplied clock signal synchronizing the first frequency signal and the second frequency signal.

19. The method of claim 17, further comprising:
adjusting, by the third processor, the correlation of a phase noise of the first frequency signal and a phase noise of the second frequency signal to be lower than a predetermined threshold.

20. The method of claim 17,
wherein the first processor is included in the first RF chip and the second processor is included in the second RF chip, and
wherein each of the first processor and the second processor includes a phased locked loop (PLL) circuit.

* * * * *